(12) United States Patent
Zhang et al.

(10) Patent No.: US 8,264,272 B2
(45) Date of Patent: Sep. 11, 2012

(54) DIGITAL CONTROL INTERFACE IN HETEROGENEOUS MULTI-CHIP MODULE

(75) Inventors: Liyang Zhang, West Hills, CA (US); Pei-Ming Daniel Chow, Los Angeles, CA (US); Mau-Chung Frank Chang, Los Angeles, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 515 days.

(21) Appl. No.: 12/428,362

(22) Filed: Apr. 22, 2009

(65) Prior Publication Data

US 2010/0271136 A1   Oct. 28, 2010

(51) Int. Cl.
| H03K 19/0175 | (2006.01) |
| H03F 3/04 | (2006.01) |
| H03F 3/20 | (2006.01) |

(52) U.S. Cl. .......... 327/433; 327/333; 327/566; 326/64; 326/84; 330/157

(58) Field of Classification Search .................. None
See application file for complete search history.

(56) References Cited

U.S. PATENT DOCUMENTS

| 4,453,095 | A | * | 6/1984 | Wrathall | 326/66 |
| 4,517,535 | A | | 5/1985 | Pon | |
| 5,072,139 | A | * | 12/1991 | Nakamura | 326/63 |
| 5,352,941 | A | * | 10/1994 | Matsumoto et al. | 326/77 |
| 5,359,553 | A | * | 10/1994 | Shiomi | 365/189.11 |
| 5,465,057 | A | * | 11/1995 | Takahashi | 326/66 |
| 5,666,089 | A | | 9/1997 | Ehlers | |
| 5,821,825 | A | * | 10/1998 | Kobayashi | 331/66 |
| 5,838,031 | A | * | 11/1998 | Kobayashi et al. | 257/197 |
| 6,114,874 | A | * | 9/2000 | Bales | 326/66 |
| 6,359,518 | B1 | * | 3/2002 | Aoki | 330/311 |
| 6,784,760 | B2 | | 8/2004 | Olcen et al. | |
| 7,382,186 | B2 | * | 6/2008 | Apel et al. | 330/129 |
| 7,629,851 | B2 | * | 12/2009 | Tsurumaki et al. | 330/285 |
| 7,741,912 | B1 | * | 6/2010 | Nadimpalli | 330/285 |
| 2001/0028282 | A1 | | 10/2001 | Nishibe | |
| 2003/0184461 | A1 | | 10/2003 | Goyette et al. | |
| 2006/0097821 | A1 | | 5/2006 | Ju et al. | |
| 2006/0232357 | A1 | | 10/2006 | Roldan et al. | |
| 2007/0176665 | A1 | | 8/2007 | Zhang et al. | |
| 2007/0268096 | A1 | | 11/2007 | Yamamoto et al. | |

* cited by examiner

*Primary Examiner* — Lincoln Donovan
*Assistant Examiner* — Terry L Englund
(74) *Attorney, Agent, or Firm* — King & Spalding L.L.P.

(57) ABSTRACT

A front-end module comprises a plurality of chips that includes first and second functional blocks and an interconnection circuit. The first functional block is formed using a first process type and includes a digital control circuit that generates a digital control signal in response to an external control signal from outside the front end module. The second functional block is formed using a second process type and includes a digitally controlled circuit controlled by the digital control signal generated by the first functional block. The second process type is different from the first process type. The interconnection circuit couples the digital control circuit and the digitally controlled circuit to provide the digital control signal to the digitally controlled circuit. In one aspect, the first functional block may be a low noise amplifier formed by a pseudomorphic high electron mobility transistor process. The second functional block may be a power amplifier formed by a heterojunction bipolar transistor process. In another aspect, the first functional block may be a power amplifier formed by a heterojunction bipolar transistor process. The second functional block may be a low noise amplifier formed by a pseudomorphic high electron mobility transistor process.

16 Claims, 3 Drawing Sheets

DIGITAL CONTROL INTERFACE IN HETEROGENEOUS MULTI-CHIP MODULE

TECHNICAL FIELD

The present invention relates to heterogeneous multi-chip modules, and, more particularly, heterogeneous multi-chip modules including digital control.

BACKGROUND

A front-end module is typically a heterogeneous multi-chip module, a single package incorporating a plurality of chips, each of which uses one specific technology in fabrication and achieves a specific function in the front-end module. For example, a Wi-Fi or cellular handset front-end module frequently incorporates three or more chips to achieve low noise amplifier and/or switch, power amplifier, and digital control interface functions. Some front-end module may also incorporate a passive chip on an integrated passive device. Each of the chips employs a preferred technology that differs from each other to achieve competitiveness, both performance-wise and cost-wise. For example, heterojunction bipolar transistors (HBT) is a preferred technology for a power amplifier, pseudomorphic high electron mobility transistors (pHEMT) is a preferred technology for a low noise amplifier/switch, and CMOS is a preferred technology for digital control interface. High chip numbers and increased technology types inevitably elevate module level integration or packaging complexity and consequently raise the front-end module cost.

One common practice for lowering front-end module cost is to cut chip count. Using fewer chips to achieve the same functions with the same performance, however, typically requires combined or integrated technologies. For example, SiGe BiCOMS and GaAs BiFET are combinations of HBT technology and FET technologies. Totally front-end module cost reduction is not evident even an integrated technology allows a group of respective functions to be integrated into a single chip. The reason lies in that more process steps and larger mask counts of the integrated technology will significantly increase the chip fabrication cost. In fact, each of the functional blocks in the integrated chip actually uses almost exclusively a corresponding portion of the integrated technology. For example, a power amplifier functional block uses almost exclusively the HBT portion of the integrated BiCMOS technology while a bias/control interface circuit uses almost exclusively the CMOS portion of a SiGe BiCMOS process to implement a power amplifier and control interface. In some cases, the increased process steps increase the overall cost of the front-end module.

SUMMARY

The present invention provides a method to reduce front-end module cost by lowering chip count in a heterogeneous front-end module without integrating technology or sacrificing front-end module performance. The present invention provides a digital control interface implementation in fundamental chips of a front-end module without adding a dedicated control chip which conventionally uses a specific technology.

In one aspect, a front-end module comprises a multi-chip module that includes first and second functional blocks and an interconnection circuit. The first functional block is formed using a first process type and includes a digital control interface that receives and conditions an external control signal from outside the front-end module and functions to digitally control the operation of the second functional block by applying a conditioned digital control signal to the second functional block. The second functional block is formed using a second process type and includes a digitally controlled circuit receives the conditioned digital control signal generated by the digital interface of the first functional block in response to the external control signal and operates in response to the external control signal. The second process type is different from the first process type. The interconnection circuit couples the control circuits and the digitally controlled circuits to apply the conditioned digital control signal generated by the digital control interface in the first functional block to the digitally controlled circuit in the second functional block. The interconnect circuit between the two functional blocks may or may not be a part of RF path of the front-end module.

In another aspect, the first functional block is a low noise amplifier, the second functional block is a power amplifier, the first process type is a pseudomorphic high electron mobility transistor (pHEMT) process, and the second process type is a heterojunction bipolar transistor (HBT) process.

In yet another aspect, the first functional block is a power amplifier, the second functional block is a low noise amplifier, the first process type is a HBT process, and the second process type is a pHEMT process.

DETAILED DESCRIPTION

Figure 1:
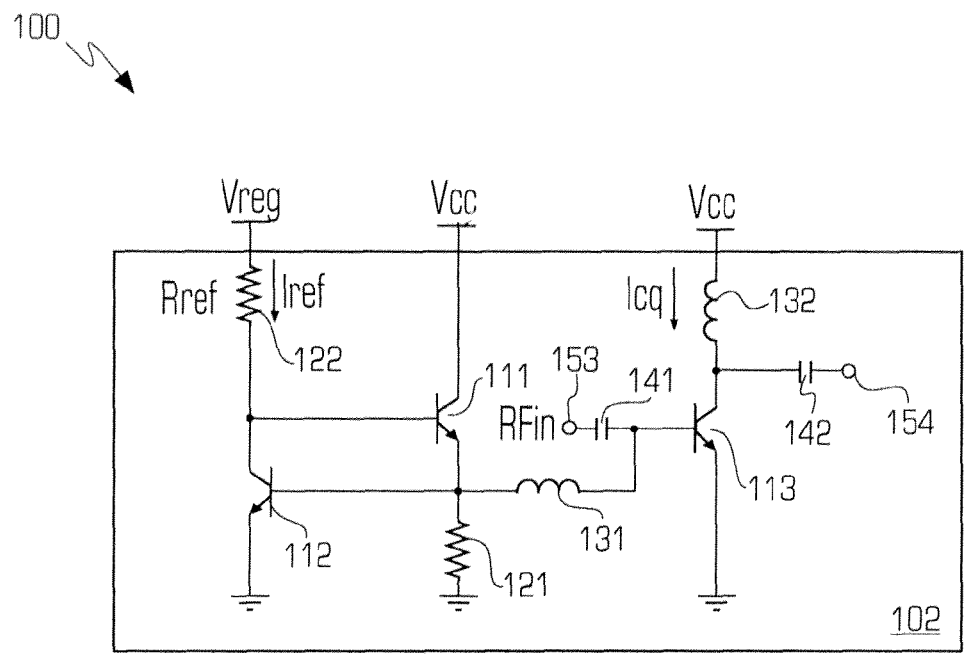
FIG. 1 is a schematic diagram illustrating a conventional wireless front-end module including a power amplifier.

FIG. 1 is a schematic diagram illustrating a conventional wireless front-end module 100. The front-end module 100 comprises a chip 102 that includes a power amplifier and a control circuit for controlling the power amplifier. The chip 102 comprises a plurality of transistors 111, 112 and 113, a plurality of resistors 121 and 122, a plurality of inductors 131 and 132, and a plurality of capacitors 141 and 142.

The control circuit comprises the transistors 111 and 112 and the resistors 121 and 122. The power amplifier comprises the transistor 113, the plurality of inductors 131 and 132, and the plurality of capacitors 141 and 142. The chip 102 is formed using one technology, namely heterojunction bipolar transistor (HBT) technology. The transistor 113 is an HBT.

The transistor 113 forms part of one of a plurality of amplification stages of the power amplifier (only one amplification stage is shown in FIG. 1 for clarity and simplicity). The amplification stage provides an RF output signal 154 in response to an RF input signal 153. The transistors 111 and 112 form a bias circuit for biasing the transistor 113. The transistor 111 typically operates as a current booster, and the transistor 113 and 112 form a pair of current mirrors, which allow a quiescent current Icq into the collector of the transistor 113 as follows:

$$Icq = n \times Iref,$$

where the transistor size ratio n equals the size of the transistor 113 divided by the size of the transistor 112, and the reference current Iref is the current flowing through the resistor 122. The size of the transistor 113 is typically optimized for RE performance. With constraints of thermal stability and lot uniformity in mass production, the mirror transistor 112 is typically chosen to have a minimal size that is 2.5~20% of the size of the transistor 113. For a linear power amplifier for wireless communication applications, the quiescent current Icq typically is about 50 milliamps.

The conventional bias/control circuit of FIG. 1 presents difficulties for use in digital power amplifier control. First, the turn on voltage is about twice the base-emitter junction turn-on voltage of the HBT 113. For an InGaP GaAs HBT, the power amplifier turn-on voltage is typically greater than 2.5 volts. However, a digital control interface may use a voltage greater than or equal to 2 Volts for a logic high. Second, the reference current Iref into the collector of the transistor 112 is typically about 1 milliamp; the sourcing capability of a digital control signal source, however, is typically about 100 microamps.

Various innovations are next described. Wireless front-end modules may include various functional blocks such as a bias/control interface, power amplifier(s), low noise amplifier(s), switch(es), and filter(s). In various aspects, the innovations herein provide for each of the functional blocks to be formed using its preferred technology. This may ease product development and production and improve trade-offs between cost and performance. In one illustrative example, a power amplifier may be formed using a GaAs/SiGe HBT, while a low noise amplifier and a switch are formed using pseudomorphic high electron mobility transistors (pHEMT), and while a bias/control interface is formed using CMOS.

In one aspect of the innovations herein, the wireless front-end modules use heterogeneous (multi-technology) multi-chip modules (HMCM).

In another aspect of the innovations herein, a digital bias or control interface is formed in a first functional block formed by a first process while the digitally controlled circuit is formed in a second functional block formed by a second process. The digital bias or control interface provides an analog to digital converting stage.

Figure 2:
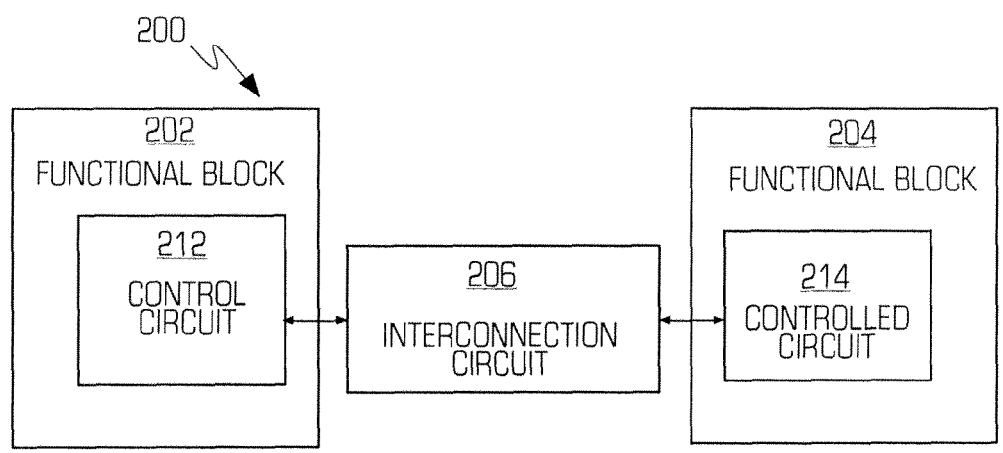
FIG. 2 is a block diagram illustrating a front-end module consistent with innovative aspects herein.

FIG. 2 is a block diagram illustrating a front-end module 200 consistent with innovative aspects herein. The front-end module 200 comprises a first functional block 202, a second functional block 204, and an interconnection circuit 206. The first functional block 202 and the second functional block 204 may be, for example, a bias/control interface, a power amplifier, a low noise amplifier, a switch circuit, and/or a filter circuit. A digital control circuit 212 is formed in the first functional block 202 using a first process type. A digitally controlled circuit 214 is formed in the second functional block 204 using a second process type. In some embodiments, the first and second process types are different. The interconnection circuit 206 couples the digital control circuit 212 and the digitally controlled circuit 214. The digital control circuit 212 and the digitally controlled circuit 214 communicate via the interconnection circuit 206. In some embodiments, the digital control circuit 212 generates a digital control signal in response to an external control signal from outside the front-end module 200.

The digital control circuit 212, the digitally controlled circuit 214, and the interconnect circuit 206 may be formed in a module. In some embodiments, the first functional block 202 and the second functional block 204 are formed in a heterogeneous multi-chip module (HMCM). In one aspect, each of the first functional block 202 and the second functional block 204 is formed in a separate chip with the functional blocks therein being formed using a corresponding technology that is suited, preferred or optimal for that functional block. In some embodiments, the digital control circuit 212 is an analog to digital converting stage formed in the first functional block 202 using the same first process type as the first functional block 202. In some embodiments, a digital control interface is formed between the digital control circuit 212 and the digitally controlled circuit 214, and is implemented between heterogeneous technology chips by combining complementary devices provided by several different technologies.

Figure 3:
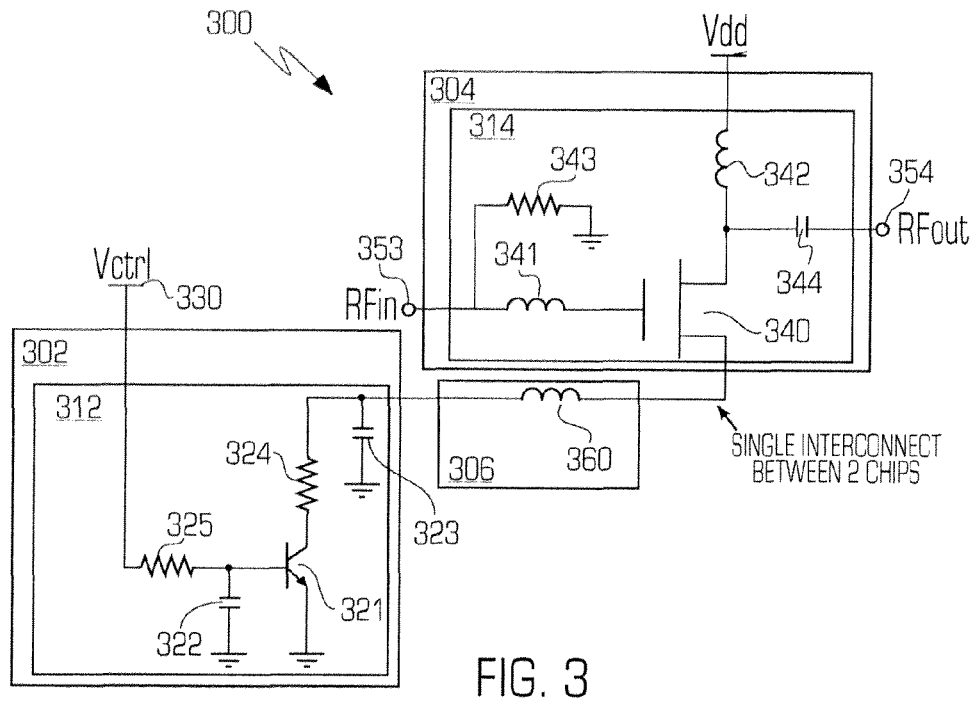
FIG. 3 is a schematic diagram illustrating a wireless front-end module including a digitally controlled low noise amplifier consistent with innovative aspects herein.
Figure 4:
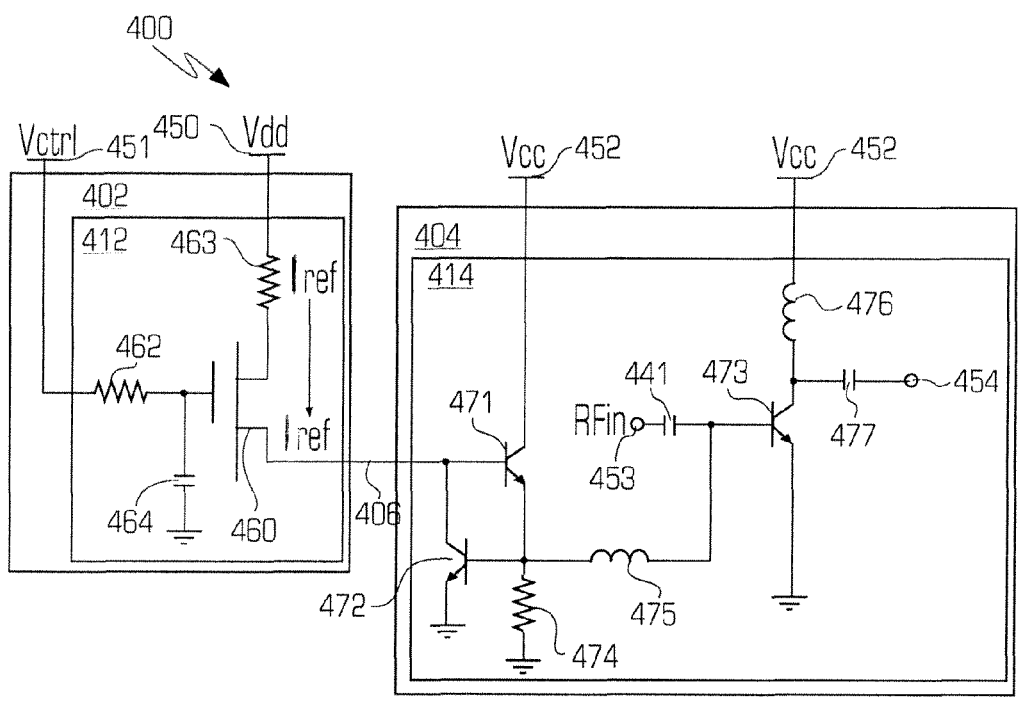
FIG. 4 is a schematic diagram illustrating a wireless front-end module including a digitally controlled power amplifier consistent with innovative aspects herein.

In some embodiments, the first functional block 202 includes a power amplifier circuit that includes the digital control circuit 212 that is formed using an HBT process, and the second functional block 204 includes the digitally controlled circuit 214, which is a low noise amplifier, that is formed using a pseudomorphic high electron mobility transistor (pHEMT) process. The front-end module of FIG. 3 is one illustrative example of this embodiment. In another embodiment, the first functional block 202 includes a digital control circuit 212 that is formed using a pHEMT process, and the second functional block 204 includes a digitally controlled circuit 214, which is a power amplifier, that is formed using an HBT process. The front-end module of FIG. 4 is one illustrative example of this embodiment.

In one aspect, the interconnection circuit 206 may be implemented using a simple circuit such as wire bonding or other packaging technologies.

Figure 5:
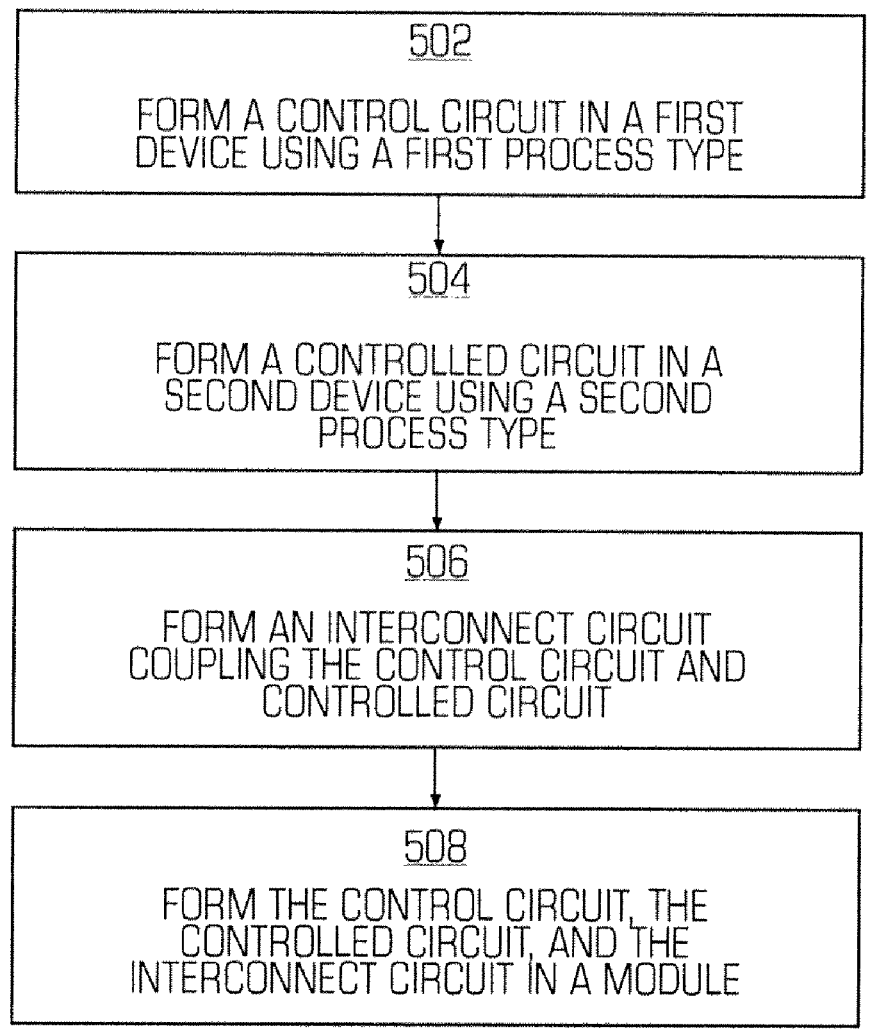
FIG. 5 is a flowchart illustrating the methodology of making the front-end module of FIG. 2 consistent with innovative aspects herein.

FIG. 5 is a flowchart illustrating the methodology of making the front-end module 200 (FIG. 2). The digital control circuit 212 is formed in the first functional block 202 using the first process type (block 502). The digitally controlled circuit 214 is formed in the second functional block 204 using the second process type (block 504). In some embodiments, the first and second process types are different. The interconnection circuit 206 is formed to couple the digital control circuit 212 and the digitally controlled circuit 214 (block 506). The digital control circuit 212, the digitally controlled circuit 214, and the interconnect circuit 206 are formed in a module (block 508).

FIG. 3 is a schematic diagram illustrating a wireless front-end module 300 including a digitally controlled low noise amplifier. In some embodiments, the wireless front-end module 300 is a multi-chip module formed using heterogeneous technology. The wireless front-end module 300 comprises a power amplifier 302 that includes a digital control circuit 312, and comprises a low noise amplifier 304 that includes a digitally controlled circuit 314. The wireless front-end module 300 further comprises an interconnection circuit 306. (Other details of the power amplifier 302 and the low noise amplifier 304 are omitted from FIG. 3 for simplicity and clarity.) The low noise amplifier 304 provides an RF output signal 354 in response to an RF input signal 353. In some embodiments, the digital control circuit 312 is an analog to digital converting stage formed in the power amplifier 302 using a HBT process. The digital control circuit 312 generates a digital control signal to digitally control the digitally controlled circuit 314 and the RF output signal 354. In some embodiments, the power amplifier 302 and the digital control circuit 312 thereof are formed using an HBT process, and the low noise amplifier 304 and the digitally controlled circuit 314 thereof are formed using a high electron mobility transistor (HEMT) process. In another embodiment, the power amplifier 302 and the digital control circuit 312 thereof are formed using an InGaP GaAs HBT process, and the low noise amplifier 304 and the digitally controlled circuit 314 thereof are formed in a low noise amplifier chip using a self-biased depletion mode pHEMT process. Alternatively, the low noise amplifier 304 and the digitally controlled circuit 314 thereof may be formed in a low noise amplifier chip using an enhanced mode HEMT process.

The digital control circuit 312 comprises a bipolar transistor 321, a plurality of capacitors 322 and 323, and plurality of resistors 324 and 325. In some embodiments, the bipolar transistor 321 is an HBT transistor. The digital control circuit 312 conditions the external control signal (Vctrl) 330 into a digital control signal for controlling the digitally controlled circuit 314 through the interconnection circuit 306.

In some embodiments, the digital control circuit 312 includes a single NPN HBT device for the transistor 321, which operates as a buffer. The external control signal 330 controls the transistor 321, to toggle the current (e.g., about 10 milliamps) used by the low noise amplifier 304. In some embodiments, the transistor 321 has a turn-on voltage of about 1.25 Volts, and provides a DC current gain that is greater than 100, which effectively drops the control current below 100 microamps in an on-state of the low noise amplifier 304. In an illustrative example, the resistor 325 has a resistance of about 5 kilohms, the digital control circuit 312 can operate with a logic high greater than 1.75 Volts using a control current of about 100 microamps drawn from the external control signal (Vctrl) 330. Having a DC current gain of about 100, the transistor 321 boosts a low control current and provides a current of about 10 milliamps to the pHEMT digitally controlled circuit 314 for low noise amplification. On the other hand, a turn on voltage of the transistor 321 of about 1.25 Volts provides a logic low of less than 0.7 Volts. Having a 1.75 Volt logic high and a 0.75 Volt logic low with only about 100 microamps current consumption, the digital control circuit 312 readily forms a digital control interface, which digitally controls the digitally controlled circuit 314, in response to the external control signal Vctrl 330 received from a digital control source. The capacitor 322 and the resistor 325 determine the turn-on speed of the transistor 321 and also form an RF damping circuit to control possible oscillation of the digital control circuit 312.

The digitally controlled circuit 314 comprises a transistor 340, a plurality of inductors 341 and 342, a resistor 343, and a capacitor 344. In some embodiments, the transistor 340 is a depletion mode pHEMT transistor. In another embodiment, the transistor 340 is self-biased.

In some embodiments, the interconnection circuit 306 comprises an inductor 360. In some embodiments, the interconnection circuit 306 is formed as a wire bond coupled between the digital control circuit 312 and the digitally controlled circuit 314. In some embodiments, the inductor 360 provides DC source degeneration RF bypass for the transistor 340 for low noise matching. In some embodiments, the inductor 360 is a spiral inductor formed on the pHEMT low noise amplifier 304. In another embodiment, the inductor 360 is an interconnect trace (such as a single bonding wire, between the pHEMT low noise amplifier 304 and the HBT power amplifier 302, which are formed in separate chips).

FIG. 4 is a schematic diagram illustrating a wireless front-end module 400 including a digitally controlled power amplifier. In some embodiments, the wireless front-end module 400 is a multi-chip module formed using heterogeneous technology. The wireless front-end module 400 comprises a low noise amplifier 402 that includes a digital control circuit 412, and comprises a power amplifier 404 that includes a digitally controlled circuit 414. The wireless front-end module 400 further comprises an interconnection circuit 406. (Other details of the low noise amplifier 402 and the power amplifier 404 are omitted from FIG. 4 for simplicity and clarity.) The power amplifier 404 provides an RF output signal 454 in response to an RF input signal 453. The digital control circuit 412 generates a digital control signal to digitally control the digitally controlled circuit 414 and the RF output signal 454. In some embodiments, the power amplifier 404 and the digitally controlled circuit 414 thereof are formed using an HBT process, and the low noise amplifier 402 and the digital control circuit 412 thereof are formed using an HEMT process. In another embodiment, the power amplifier 404 and the digitally controlled circuit 414 are formed using an InGaP GaAs HBT process, and the low noise amplifier 402 and the digital control circuit 412 thereof are formed in a low noise amplifier chip using self-biased depletion mode pHEMT. Alternatively, the Tow noise amplifier 402 and the digital control circuit 412 thereof may be formed in a low noise amplifier chip using an enhanced mode HEMT process or the like.

The digital control circuit 412 comprises a transistor 460, a plurality of resistors 462 and 463, and a capacitor 464. In some embodiments, the transistor 460 is a depletion mode pHEMT. The digital control circuit 412 converts an external control signal (Vctrl) 451 into a digital control signal for controlling the digitally controlled circuit 414 through the interconnection circuit 406.

The digital control circuit 412 is an analog to digital converting stage formed in the low noise amplifier 402 using a depletion-mode pHEMT process. In some embodiments, the drain power supply (Vdd) 450 of the transistor 460 is connected to the supply voltage (Vcc) 452, which may be, for example, greater than 2.7 Volts and sufficiently high to turn-on the power amplifier 404 once the transistor 460 is set to an on-state by external control signal (Vctrl) 451 having a logic high voltage level. On the other hand, an external control signal (Vctrl) 451 having a logic low voltage level turns off the transistor 460, the reference current Iref, and then the power amplifier 414. The capacitor 464 and the resistor 462 determine the on/off speed of the transistor 460 and also form an RF damping circuit to reduce possible oscillation.

The digitally controlled circuit 414 comprises a plurality of transistors 471, 472 and 473, a resistor 474, a plurality of inductors 475 and 476, and a capacitor 477. In some embodiments, the transistors 471, 472 and 473 are HBTs.

In an illustrative example, the transistor 460 is a depletion mode pHEMT and has a threshold voltage of about −0.75 Volts, thereby dropping the turn-on voltage of the power amplifier 414 from about 2.5 Volts to about 1.75 Volts. Further, a logic low is less than 1 Volt, and a logic high is greater than 1.75 Volts. The transistor 460 provides a depletion mode pHEMT buffer stage, which substantially eliminates the current drawn from the external control signal Vctrl 451. Having a 1.75 Volt logic high and a 1 Volt logic low with near-zero current leakage, the digital control circuit 412 readily forms a digital control interface, which digitally controls the digitally controlled circuit 414, in response to the external control signal Vctrl 451 received from a digital control source.

In some embodiments, the interconnection circuit 406 is a single interconnect (e.g., a single bonding wire coupled between the digital control circuit 412 and the digitally controlled circuit 414). In another embodiment, the interconnection circuit 406 is an interconnect trace between the pHEMT low noise amplifier 402 and the HBT power amplifier 404, which are formed in separate chips.

Although one of the functional blocks herein has been described using NPN HBT, other types of transistors may be used. For example, Silicon bipolar junction transistors (BJT, either NPN or PNP), Silicon-Germanium heterojunction bipolar transistors (SiGe HBT, either NPN or PNP), MES-FET, or MOSFET may be used to form the transistors. Although the other functional block herein has been described using pHEMT, the other function blocks may be formed by any type of field-effect transistor (FET), including HEMT, MOSFET, MESFET, and the like.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A front-end module comprising: a multi-chip module comprising: a first chip comprising a first functional block formed using a first process type and including a digital control circuit that receives an external control signal at a control voltage node and generates a digital control signal; a second chip comprising a second functional block formed using a second process type and including a digitally controlled circuit controlled by the digital control signal, wherein the digitally controlled circuit is operable to amplify a radio frequency (RF) signal and furthermore comprises an RF input terminal and RF output terminal and the second process type being different from the first process type; and an interconnection circuit coupling the digital control circuit and the digitally controlled circuit to provide the digital control signal to the digitally controlled circuit.

2. The front-end module of claim 1, wherein the first functional block is a low noise amplifier, the second functional block is a power amplifier, the first process type is a pHEMT process, and the second process type is an HBT process.

3. The front-end module of claim 1, wherein the first functional block is a power amplifier, the second functional block is a low noise amplifier, the first process type is an HBT process, and the second process type is a pHEMT process.

4. The front-end module of claim 1, wherein the digital control circuit generates the digital control signal in response to the external control signal received from outside the front-end module.

5. The front-end module according to claim 1, wherein the digitally controlled circuit is a low noise amplifier comprising: a first inductor including a first terminal coupled to the RF input terminal and including a second terminal, a first resistor including a first terminal coupled to the first terminal of the first inductor and including a second terminal coupled to a ground node, a field-effect transistor including a gate coupled to the second terminal of the first inductor, and including a source and drain, a first capacitor including a first terminal coupled to the drain of the field-effect transistor and including a second terminal coupled to the RF output terminal, and a second inductor including a first terminal coupled to the drain of the field-effect transistor and including a second terminal coupled to a supply voltage; and wherein the digital control circuit comprises a second resistor including a first terminal coupled to the control voltage node and including a second terminal, a second capacitor including a first terminal coupled to the second terminal of the second resistor and including a second terminal coupled to the ground node, a bipolar transistor including a base coupled to the second terminal of the second resistor, including an emitter coupled to the ground node, and including a collector, a third resistor including a first terminal coupled to the collector of the bipolar transistor and including a second terminal coupled to an output node of the digital control circuit, and a third capacitor including a first terminal coupled to the second terminal of the third resistor and including a second terminal coupled to the ground node; and wherein the interconnection circuit having a first terminal coupled to the output node of the digital control circuit and having a second terminal coupled to the source of the field-effect transistor of the low noise amplifier.

6. The front-end module of claim 5, wherein the interconnection circuit comprises another inductor including first and second terminals coupled to the respective first and second terminals of the interconnection circuit.

7. The front-end module of claim 5, wherein the low noise amplifier is formed using the first process type, the digital control circuit is formed using the second process type, the first process type being different from the second process type.

8. The front-end module of claim 5, wherein the low noise amplifier is formed using a pHEMT process and the digital control circuit is formed using a HBT process.

9. The front-end module according to claim 1, wherein the digitally controlled circuit is a power amplifier comprising: a first bipolar transistor including a collector, including a base, and including an emitter coupled to a ground node, a second bipolar transistor including a collector coupled to a voltage terminal, including a base coupled to the collector of the first bipolar transistor, and including an emitter coupled to the base of the first bipolar transistor, a first resistor including a first terminal coupled to the emitter of the second bipolar transistor and including a second terminal coupled to the ground node, a first inductor including a first terminal coupled to the emitter of the second bipolar transistor and including a second terminal, a first capacitor including a first terminal coupled to the RF input terminal and including a second terminal coupled to the second terminal of the first inductor, a third bipolar transistor including a base coupled to the second terminal of the first capacitor, including an emitter coupled to the ground node, and including a collector, a second inductor including a first terminal coupled to the voltage terminal and including a second terminal coupled to the collector of the third bipolar transistor, and a second capacitor including a first terminal coupled to the collector of the third bipolar transistor and including a second terminal coupled to the RF output terminal; and wherein the digital control circuit comprises: a second resistor including a first terminal coupled to the control voltage node and including a second terminal, a third capacitor including a first terminal coupled to the second terminal of the second resistor and including a second terminal coupled to the ground node, a field-effect transistor including a gate coupled to the second terminal of the second resistor, including a drain, and including a source coupled to the collector of the first bipolar transistor, and a third resistor including a first terminal coupled to the drain of the field-effect transistor and including a second terminal coupled to a second voltage terminal.

10. The front-end module of claim 9, wherein the interconnection circuit is a single wire interconnect coupled between the source of the field-effect transistor and the collector of the first bipolar transistor.

11. The front-end module of claim 9, wherein the power amplifier is formed using the first process type, the digital control circuit is formed using the second process type, the first process type being different from the second process type.

12. The front-end module of claim 9 wherein the power noise amplifier is formed using a HBT process and the digital control circuit is formed using a pHEMT process.

13. A method for making a front-end module, the method comprising: forming a digital control circuit in a first functional block using a first process type on a first chip, the digital control circuit receiving an external control signal and generating a digital control signal; forming a digitally controlled circuit in a second functional block using a second process type on a second chip, the digitally controlled circuit operating in response to the digital control signal and amplifying a radio frequency (RF) signal received through an RF input and outputting the amplified RF signal through an RF output and; forming an interconnection circuit to couple the digital control circuit of the first chip and the digitally controlled circuit of the second chip for communicating the digital control signal there between; and forming the digital control circuit, the digitally controlled circuit, and the interconnection circuit in a multi-chip arrangement within the front-end module.

14. The method of claim 13, wherein the front-end module is a heterogeneous multi-chip module.

15. A front-end module comprising: a multi-chip module comprising: a first chip comprising a first functional block formed using a first process type and including a digital control circuit that generates a digital control signal; a second chip comprising a second functional block formed using a second process type and including a digitally controlled circuit controlled by the digital control signal, the second process type being different from the first process type; and an interconnection circuit coupling the digital control circuit and the digitally controlled circuit to provide the digital control signal to the digitally controlled circuit, wherein the digitally controlled circuit is a low noise amplifier comprising:
 a first inductor including a first terminal coupled to an RF input terminal and including a second terminal,
 a first resistor including a first terminal coupled to the first terminal of the first inductor and including a second terminal coupled to a ground node,
 a field-effect transistor including a gate coupled to the second terminal of the first inductor, and including a source and drain,
 a first capacitor including a first terminal coupled to the drain of the field-effect transistor and including a second terminal coupled to an RF output terminal, and
 a second inductor including a first terminal coupled to the drain of the field-effect transistor and including a second terminal coupled to a supply voltage;
and wherein the digital control circuit comprises:
 a second resistor including a first terminal coupled to a control voltage node and including a second terminal,
 a second capacitor including a first terminal coupled to the second terminal of the second resistor and including a second terminal coupled to the ground node,
 a bipolar transistor including a base coupled to the second terminal of the second resistor, including an emitter coupled to the ground node, and including a collector,
 a third resistor including a first terminal coupled to the collector of the bipolar transistor and including a second terminal coupled to an output node of the digital control circuit, and
 a third capacitor including a first terminal coupled to the second terminal of the third resistor and including a second terminal coupled to the ground node;
and wherein the interconnection circuit having a first terminal coupled to the output node of the digital control circuit and having a second terminal coupled to the source of the field-effect transistor of the low noise amplifier.

16. A front-end module comprising: a multi-chip module comprising: a first chip comprising a first functional block formed using a first process type and including a digital control circuit that generates a digital control signal; a second chip comprising a second functional block formed using a second process type and including a digitally controlled circuit controlled by the digital control signal, the second process type being different from the first process type; and an interconnection circuit coupling the digital control circuit and the digitally controlled circuit to provide the digital control signal to the digitally controlled circuit, wherein the digitally controlled circuit is a power amplifier comprising:
 a first bipolar transistor including a collector, including a base, and including an emitter coupled to a ground node,
 a second bipolar transistor including a collector coupled to a voltage terminal, including a base coupled to the collector of the first bipolar transistor, and including an emitter coupled to the base of the first bipolar transistor,
 a first resistor including a first terminal coupled to the emitter of the second bipolar transistor and including a second terminal coupled to the ground node,
 a first inductor including a first terminal coupled to the emitter of the second bipolar transistor and including a second terminal,
 a first capacitor including a first terminal coupled to an RF input terminal and including a second terminal coupled to the second terminal of the first inductor,
 a third bipolar transistor including a base coupled to the second terminal of the first capacitor, including an emitter coupled to the ground node, and including a collector,
 a second inductor including a first terminal coupled to the voltage terminal and including a second terminal coupled to the collector of the third bipolar transistor, and
 a second capacitor including a first terminal coupled to the collector of the third bipolar transistor and including a second terminal coupled to an output node;
and wherein the digital control circuit comprises:
 a second resistor including a first terminal coupled to a control voltage node and including a second terminal,
 a third capacitor including a first terminal coupled to the second terminal of the second resistor and including a second terminal coupled to the ground node,
 a field-effect transistor including a gate coupled to the second terminal of the second resistor, including a drain, and including a source coupled to the collector of the first bipolar transistor, and
 a third resistor including a first terminal coupled to the drain of the field-effect transistor and including a second terminal coupled to a second voltage terminal.

* * * * *